(12) United States Patent
Jia et al.

(10) Patent No.: US 11,398,284 B2
(45) Date of Patent: Jul. 26, 2022

(54) METHOD OF PERFORMING PROGRAMMING OPERATION AND RELATED MEMORY DEVICE

(71) Applicant: YANGTZE MEMORY TECHNOLOGIES CO., LTD., Wuhan (CN)

(72) Inventors: Xinlei Jia, Wuhan (CN); Shan Li, Wuhan (CN); Yali Song, Wuhan (CN); Lei Jin, Wuhan (CN); Hongtao Liu, Wuhan (CN); Jianquan Jia, Wuhan (CN); XiangNan Zhao, Wuhan (CN); Yuan-Yuan Min, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/180,689

(22) Filed: Feb. 19, 2021

(65) Prior Publication Data

US 2021/0174885 A1 Jun. 10, 2021

Related U.S. Application Data

(63) Continuation of application No. 16/792,304, filed on Feb. 17, 2020, now Pat. No. 10,957,409, which is a (Continued)

(51) Int. Cl.
*G11C 16/04* (2006.01)
*G11C 16/34* (2006.01)
(Continued)

(52) U.S. Cl.
CPC ...... *G11C 16/3427* (2013.01); *G11C 16/0483* (2013.01); *G11C 16/08* (2013.01); *G11C 16/10* (2013.01)

(58) Field of Classification Search
CPC . G11C 16/3427; G11C 16/0483; G11C 16/08; G11C 16/10
(Continued)

(56) References Cited

U.S. PATENT DOCUMENTS

| 10,580,504 B2 | 3/2020 | Zhao et al. |
| 2004/0027856 A1* | 2/2004 | Lee ............... G11C 16/0408 365/185.11 |

(Continued)

FOREIGN PATENT DOCUMENTS

WO 2011/149823 A1 12/2011

*Primary Examiner* — Vu A Le
(74) *Attorney, Agent, or Firm* — Bayes PLLC

(57) ABSTRACT

A memory device includes a memory array including memory strings. Each memory string includes a plurality of top memory cells, a plurality of bottom memory cells, and one or more dummy memory cells between the top memory cells and the bottom memory cells. The memory device also includes a plurality of word lines respectively coupled to gate terminals of the top memory cells and the bottom memory cells. The memory device further includes a control circuit configured to provide a control signal to control programming a target memory cell of the top memory cells. The gate terminal of the target memory cell are coupled to a selected word line of the word lines. The memory device further includes a word line driver coupled to the control circuit and the word lines and configured to, in response to the control signal, apply a positive first voltage signal to each of the word lines that are coupled to the gate terminals of the top memory cells during a first time period in a pre-charge phase prior to a programming phase.

20 Claims, 6 Drawing Sheets

Related U.S. Application Data continuation of application No. PCT/CN2019/118312, filed on Nov. 14, 2019.

(51) Int. Cl.
*G11C 16/10* (2006.01)
*G11C 16/08* (2006.01)

(58) Field of Classification Search
USPC .................................................. 365/185.02
See application file for complete search history.

(56) References Cited

U.S. PATENT DOCUMENTS

| | | | |
|---|---|---|---|
| 2013/0163330 A1* | 6/2013 | Sharon | G06F 11/1072 365/185.17 |
| 2015/0179269 A1 | 6/2015 | Lee | |
| 2017/0084315 A1* | 3/2017 | Lee | G11C 7/1057 |
| 2019/0189223 A1 | 6/2019 | Yun | |

* cited by examiner

METHOD OF PERFORMING PROGRAMMING OPERATION AND RELATED MEMORY DEVICE

CROSS-REFERENCE TO RELATED APPLICATIONS

This application is a continuation of U.S. application Ser. No. 16/792,304, filed on Feb. 17, 2020, which is a continuation of International Application No. PCT/CN2019/118312 filed on Nov. 14, 2019, both of which are incorporated herein by reference in their entireties.

BACKGROUND

The present disclosure relates to a method of performing a programming operation, and more particularly, to a method of performing a programming operation to a three-dimensional (3D) NAND memory device.

Semiconductor memories are widely used in various electronic devices such as cellular phones, digital cameras, personal digital assistants, medical electronic devices, mobile computing devices and non-mobile computing devices. A nonvolatile memory allows information to be stored and retained. Examples of the nonvolatile memory comprises a flash memory (e.g., NAND type and NOR type flash memory) and electrically erasable programmable read only memory (Electrically Erasable Programmable Read-Only Memory, EEPROM).

Memory cells in some NAND architectures have a charging storage region that holds charging to program the memory cells. One example of a charging storage region is a floating gate. When programming an EEPROM or flash memory device, such as a NAND flash memory device, typically a program voltage is applied to the control gate (or selected word line) and the bit line is grounded. Electrons from the channel are injected into the charging storage region. When electrons accumulate in the charging storage region, the charging storage region becomes negatively charging and the threshold voltage of the memory cell is raised so that the memory cell is in a programmed state.

Applicant notices that, during the pre-charging phase, residual electrons may be trapped in storage regions of dummy cells of an unselected string to cause program disturb to the selected memory cell of the selected string which is neighboring to the unselected string. For example, during a boosting/programming phase, the residual electrons trapped in the unselected string may reduce the channel potential corresponding to the selected memory cell of the selected string to cause program disturb.

Therefore, there is a need to provide a method and memory device to reduce program disturb.

SUMMARY

It is therefore an objective of the present disclosure to provide a method and related memory device to reduce program disturb.

The present disclosure discloses a method of performing a programming operation to a three-dimensional (3D) NAND memory device. The method includes during a pre-charging phase of the programming operation, applying a first voltage to a plurality of word lines of the 3D NAND memory device, wherein the plurality of word lines is located vertically above a plurality of dummy word lines; during the pre-charging phase, applying a second voltage to a second neighboring word line of the 3D NAND memory device, wherein the second neighboring word line is one of the plurality of word lines and located vertically above a selected word line of the plurality of word lines; and during a boosting phase of the programming operation, applying the second voltage to the second neighboring word line and a plurality of first word lines of the plurality of word lines, and apply a third voltage to a first neighboring word line of the 3D NAND memory device, wherein the first neighboring word line is one of the plurality of word lines but excluded from the plurality of first word lines and located vertically below the second neighboring word line and above the selected word line.

The present disclosure further discloses a three dimensional (3D) NAND memory device including a memory array comprising a plurality of bit lines, a plurality of word lines and a plurality of strings; a word line driver coupled to the memory array, and configured to generate a plurality of voltages applied to the plurality of word lines of the memory array according to a plurality of control signals; and a control circuit configured to generate the plurality of control signals according to a process of performing a programming operation, wherein the process includes steps of the method of performing the programming operation to a three dimensional (3D) NAND memory device as above mentioned.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
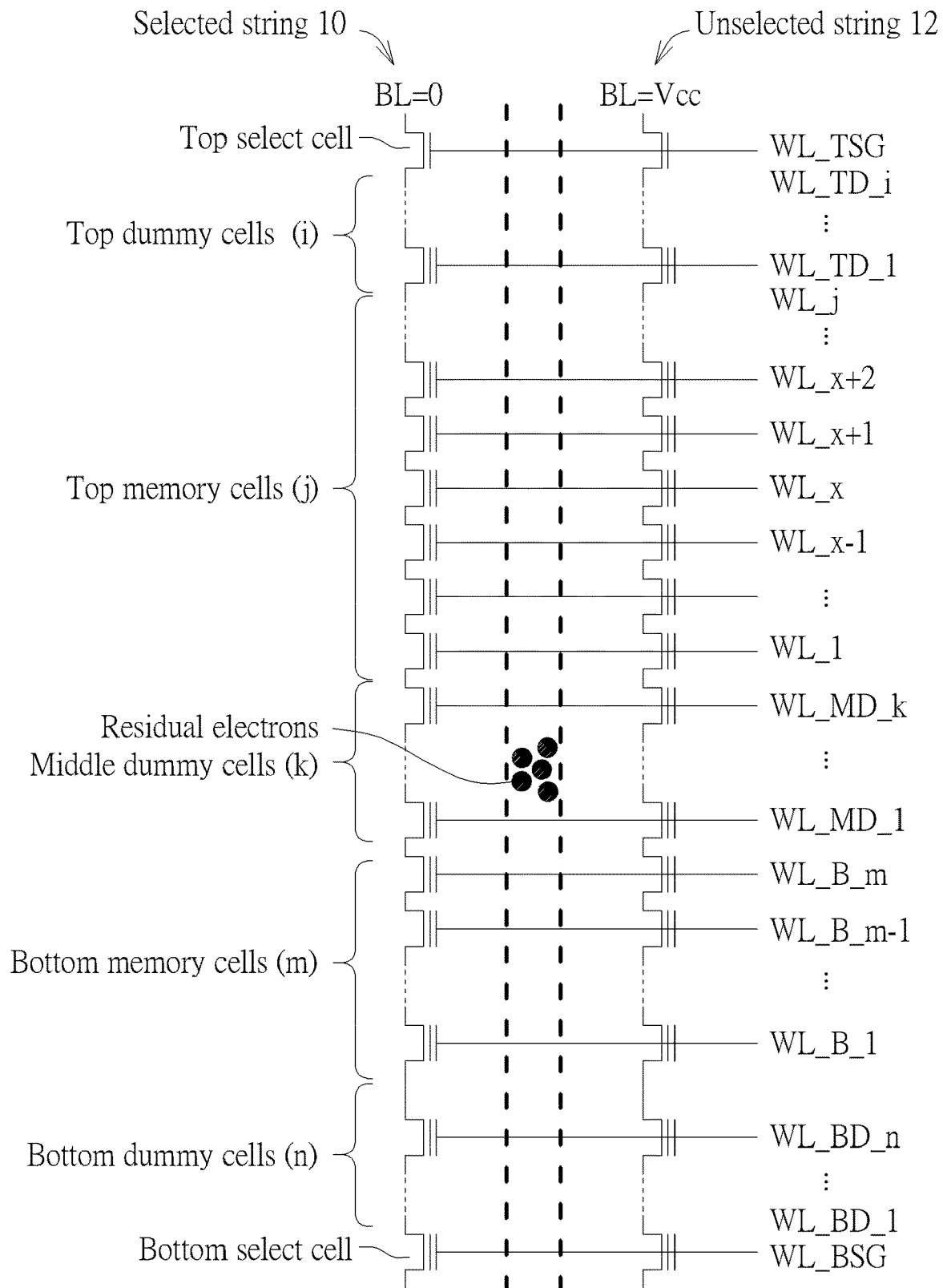
FIG. 1 illustrates residual electrons remained in a channel of an unselected string which neighbors a selected string.

FIG. 1 illustrates residual electrons remained in a channel of an unselected string 12 which neighbors a selected string 10. A memory array may include the selected string 10 and the unselected string 12. The memory array may be a three-dimensional NAND flash memory array including a plurality of bit-lines, a plurality of word lines, and a plurality of strings, wherein each of the strings extends vertically, and includes a plurality of memory cells formed in a plurality of horizontal layers.

The strings 10 and 12 are structurally identical; for example, each of the strings 10 and 12 may include a top select cell, a plurality of top dummy cells, a plurality of top memory cells, a plurality of middle dummy cells, a plurality of bottom memory cells, a plurality of bottom dummy cells, and a bottom select cell, wherein the cells included in the string are serially connected. The plurality of top dummy cells includes i cells, the plurality of top memory cells includes j cells, the plurality of middle dummy cells includes k cells, the plurality of bottom memory cells includes m cells, and the plurality of bottom dummy cells includes n cells, wherein i, j, k, m and n are integers greater than 1.

A word line WL_TSG is connected to gates of the top select cells of the strings 10 and 12. A plurality of word lines WL_TD_1 to WL_TD_i is connected to a plurality of gates of the plurality of top dummy cells. A plurality of word lines WL_1 to WL_j is connected to a plurality of gates of the plurality of top memory cells of the strings 10 and 12. One of the plurality of word lines WL_1 to WL_j is a selected word line WL_x connected to a selected memory cell of the selected string 10 and a memory cell that is horizontally neighboring to the selected memory cell. One of the plurality of word lines WL_1 to WL_j is a first neighboring word line WL_x+1 connected to a first neighboring memory cell that is vertically neighboring to the selected memory cell of the selected string 10. One of the plurality of word lines WL_1 to WL_j is a second neighboring word line WL_x+2 connected to a second neighboring memory cell that is vertically neighboring to the first neighboring memory cell of the selected string 10.

A plurality of word lines WL_MD_1 to WL_MD_k is connected to a plurality of gates of the plurality of middle dummy cells of the strings 10 and 12. A plurality of word lines WL_B_1 to WL_B_m is connected to a plurality of gates of the plurality of bottom dummy cells of the strings 10 and 12. A plurality of word lines WL_BD_1 to WL_BD_n is connected to a plurality of gates of the plurality of bottom dummy cells of the strings 10 and 12. A word line WL_BSG is connected to gates of the bottom select cells of the strings 10 and 12.

A drain of the top select cell is connected to a bit-line (BL), and the bit line of the selected string 10 is always applied with zero (ground) voltage during a programming operation, while the bit line of the unselected string 12 is applied with a system voltage pulse Vcc during a pre-charging phase of the programming operation. During a pre-charging phase of the programming operation, a certain amount of residual electrons may be trapped in storage regions of the plurality of middle dummy cells corresponding to the plurality of word lines WL_MD_1 to WL_MD_k of the unselected string 12 to cause program disturb to the neighboring selected string 10.

Figure 2:
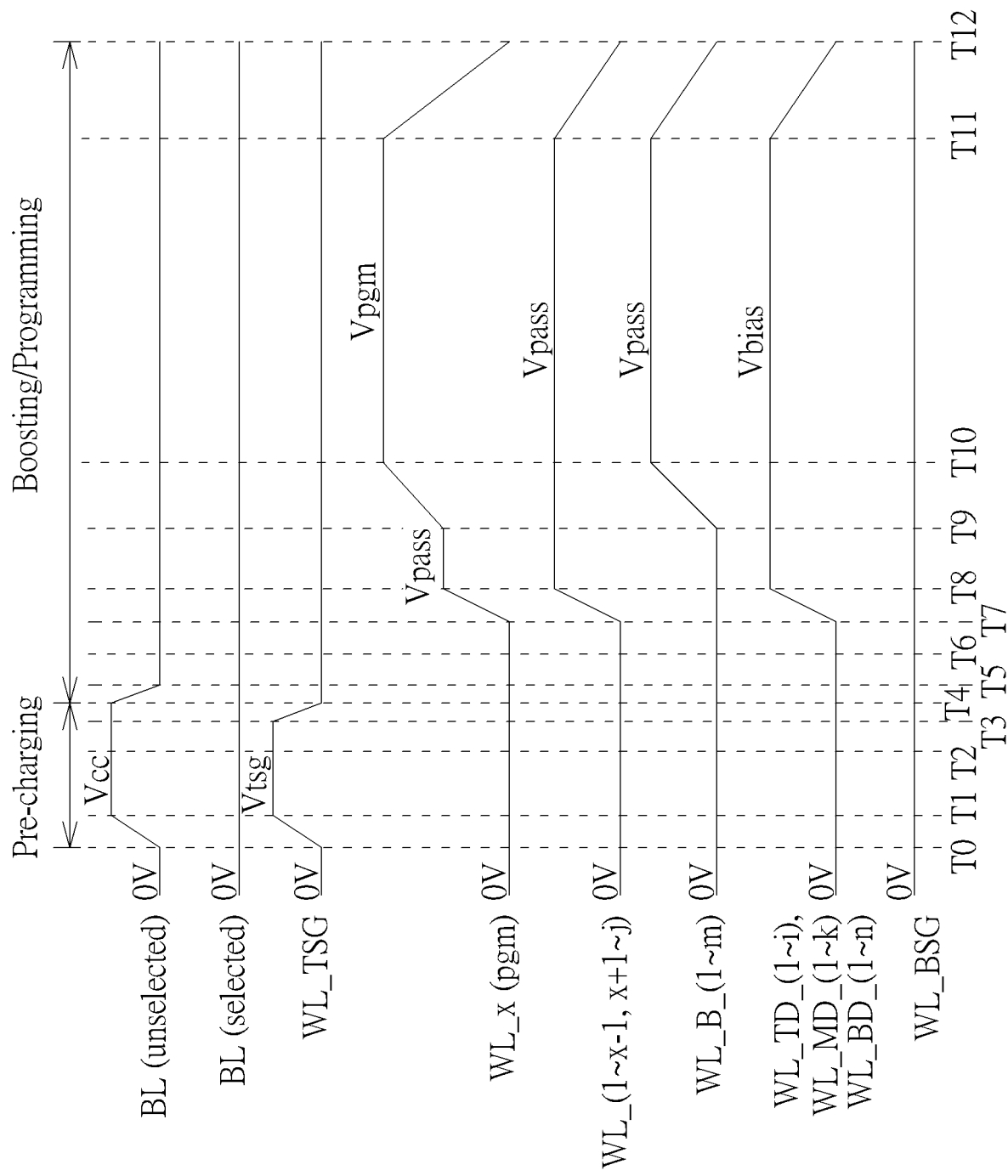
FIG. 2 is a signal diagram of a programming process for the strings in FIG. 1.

FIG. 2 is a signal diagram of a programming operation for the strings 10 and 12 in FIG. 1. During a pre-charging phase, the voltage of the bit line of the selected string 10 increases from zero volt at time T0 to a voltage Vcc at time T1. The voltage of the word line WL_TSG increases from zero volt at time T0 to a voltage Vtsg at time T1, and the voltage of the word line WL_TSG decreases from the voltage Vtsg at time T3 to zero volt at time T4. The word lines WL_BSG, WL_BD_1 to WL_BD_n, WL_B_1 to WL_B_m, WL_MD_1 to WL_MD_k, WL_1 to WL_j, and WL_TD_1 to WL_TD_i are at zero volt during the pre-charging phase. One of the plurality of word lines WL_1 to WL_j is a selected word line WL_x.

During time T1 to time T2, a certain amount of residual electrons may be trapped in storage regions of the plurality of middle dummy cells corresponding to the plurality of word lines WL_MD_1 to WL_MD_k of the unselected string 12 to cause program disturb to the neighboring selected string 10. For example, during a boosting phase of the unselected string 12 and a programming phase of the selected string 10, in particular from time T9 to time T10, a voltage Vpass is applied to the word lines WL_B_1 to WL_B_m and WL_1 to WL_j corresponding to the memory cells to increase the channel potential of the memory cells, and a voltage Vbias is applied to the word lines WL_BD_1 to WL_BD_n, WL_MD_1 to WL_MD_k and WL_TD_1 to WL_TD_i corresponding to the dummy cells to increase the channel potential of the dummy cells. During time T10 to time T11, a programming voltage Vpgm is applied to the selected word line WL_x. However, the residual electrons at the middle dummy cells of the unselected string 12 may induce a lateral field to the neighboring selected string 10 to cause program disturb. For example, the channel potential corresponding to the selected memory cell of the selected string 10 is decreased due to the lateral field induced by the residual electrons.

Figure 3:
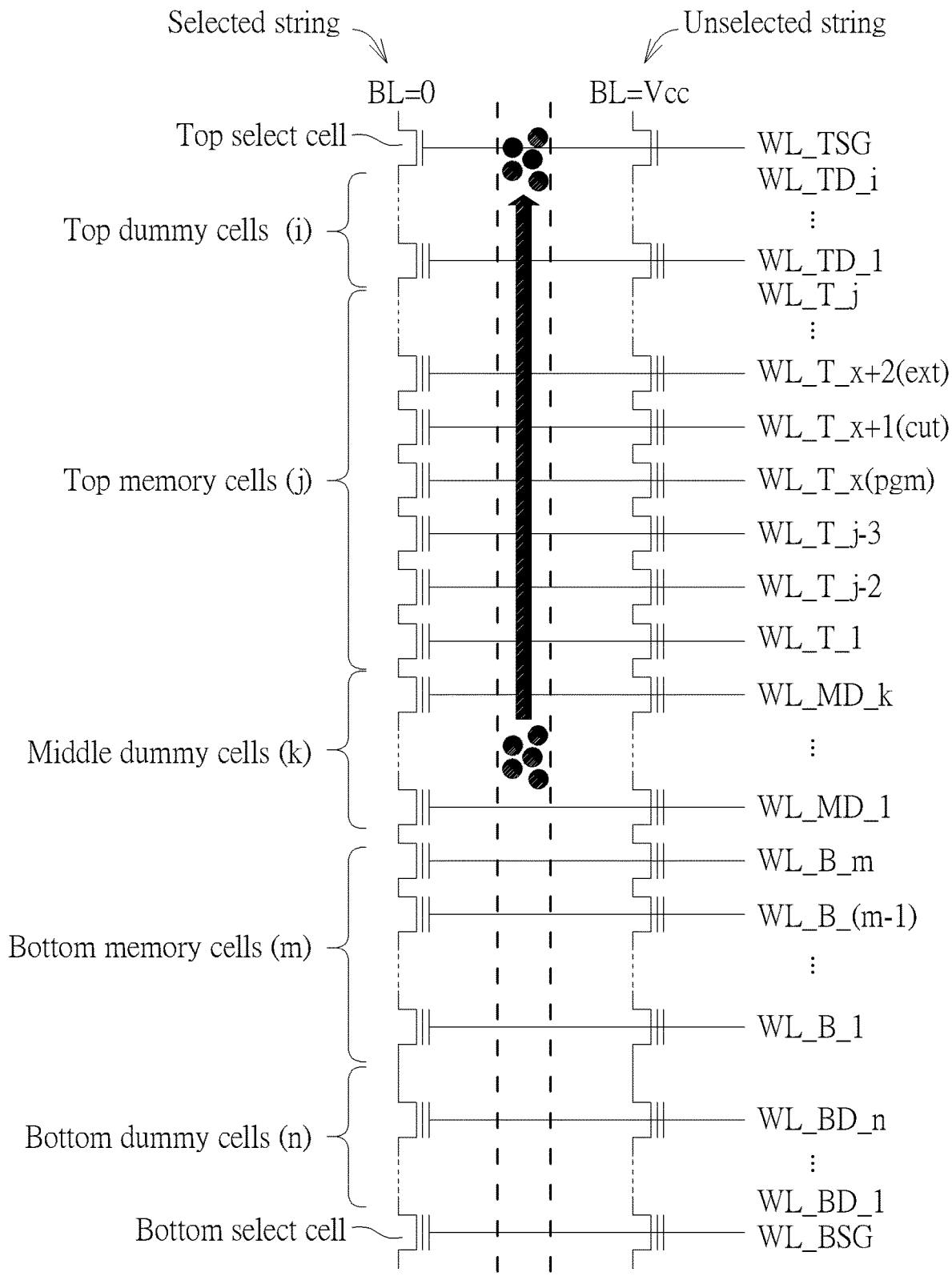
FIG. 3 illustrates movement of residual electrons remained in a channel of an unselected string which neighbors a selected string according to an embodiment of the present disclosure.

To reduce program disturb, please refer to FIG. 3, which illustrates movement of residual electrons remained in a channel of an unselected string 12 which neighbors a selected string 10 according to an embodiment of the present disclosure. In order to reduce the residual electrons to avoid program disturb, during the pre-charging phase, all the word lines WL_T_1 to WL_T_j corresponding to all the plurality of top memory cells are applied with a voltage Von to partially turn on the channel of the unselected string 12, thereby the residual electrons can move from the middle dummy cells to the plurality of top memory cells along the partially turned-on channel. Further, during the pre-charging phase after the word lines WL_T_1 to WL_T_x−1 and WL_T_x+3 to WL_T_j are applied with zero volt to partially turn off the channel of the unselected string 12. Finally, during the boosting/programming phase, the word line WL_T_x+1 is applied with a voltage Vcut (e.g., Von) to weakly turn off the top memory cell corresponding to the word line WL_T_x+1, thereby the channel of the unselected string 12 is partially turn off to prevent the residual electrons from moving back to the top memory cells which are below the top memory cell corresponding to the word line WL_T_x+1. As a result, the residual electrons can be removed from the plurality of middle dummy cells to avoid program disturb.

Figure 4:
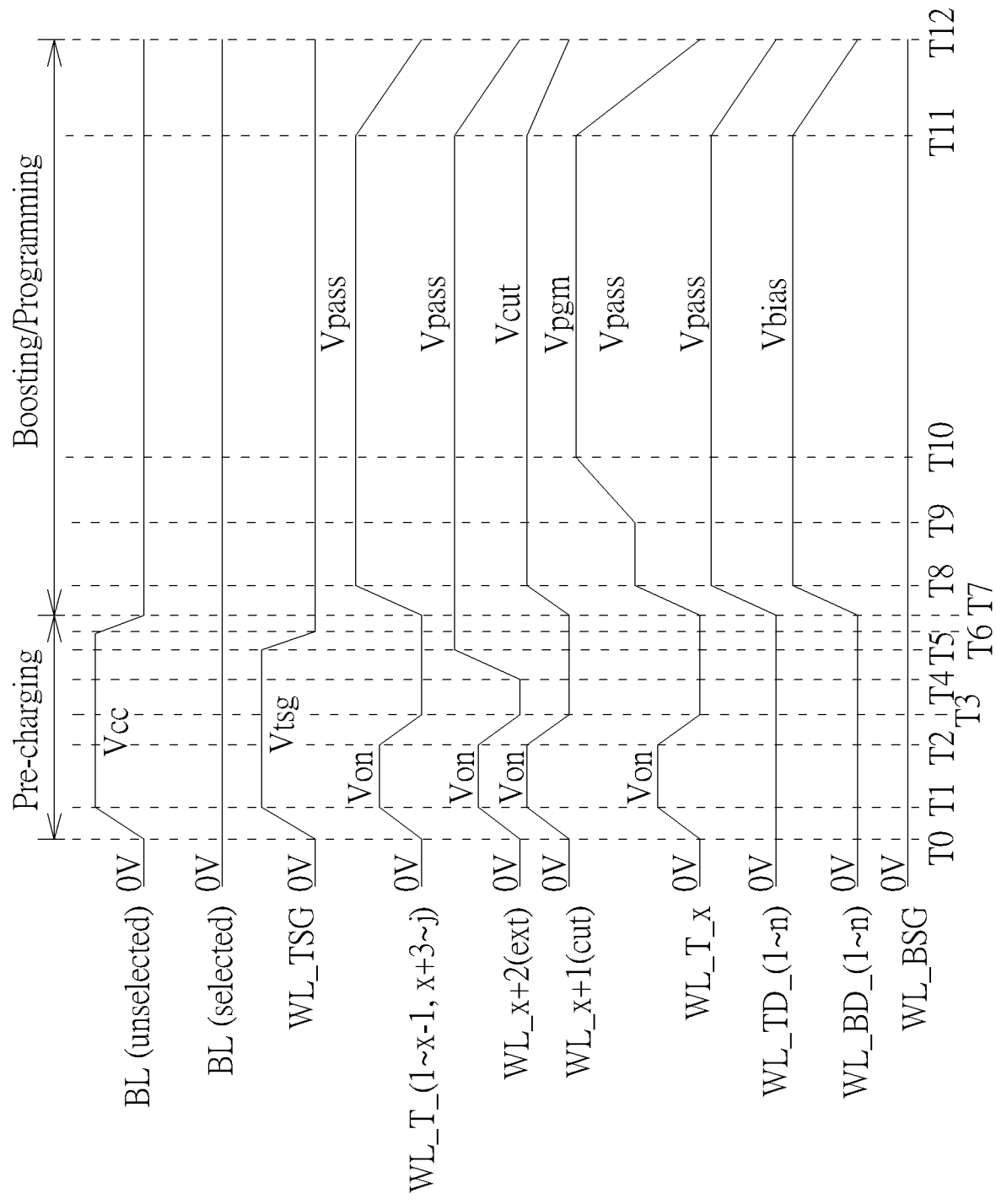
FIG. 4 is a signal diagram of a programming operation for the strings in FIG. 3.

FIG. 4 is a signal diagram of a programming operation for the strings 10 and 12 in FIG. 3. In detail, the pre-charging phase begins at time T0 and ends at time T7. A voltage of the bit line of the unselected string 12 increases from zero volt at time T0 to a voltage Vcc at time T1, the voltage Vcc is applied to the bit line of the unselected string 12 from time T1 to time T6, and the voltage of the bit line of the unselected string 12 decreases from the voltage Vcc at time T6 to zero volt at time T7. The bit line of the selected string 10 is always applied with zero volt during the programming operation. A voltage of the word line WL_TSG increases from zero volt at time T0 to a voltage Vtsg at time T1, the voltage Vtsg is applied to the word line WL_TSG from time T1 to time T5, and the voltage of the word line WL_TSG decreases from the voltage Vtsg at time T5 to zero volt at time T6 when the pre-charging phase is about to end. Voltages of the word lines WL_B_1 to WL_B_m, WL_TD_1 to WL_TD_i, WL_MD_1 to WL_MD_k and WL_BD_1 to WL_BD_n are always applied with zero volt during the pre-charging phase of the programming operation.

From time T1 to time T2, a voltage Von is applied to the word lines WL_T_1 to WL_T_j to partially turn on the channel at the plurality of top memory cells. Therefore, the residual electrons trapped at the storage regions of the plurality of middle dummy cells of the unselected string 12 can move toward the top memory cells corresponding to the word lines WL_T_1 to WL_T_j when they are attracted by the voltage potential provided by the voltage Von. From time T2 to time T3, the voltage of the word lines WL_T_1 to WL_T_j decreases from the voltage Von to zero volt to turn off the channel of the unselected string 12 at the plurality of top memory cells corresponding to the word lines WL_T_1 to WL_T_j. Note that a circuit area of a control circuit configured to control a memory array depends on a complexity of the programming operation; for example, the control circuit requires a larger area to perform a more complex programming operation. By applying the voltage Von to all the word lines WL_T_1 to WL_T_j corresponding to all the plurality of top memory cells during the pre-charging phase, the complexity of the programming operation is acceptable in comparison with the complexity of the programming operation in FIG. 2.

A voltage of the word line WL_T_x+2 corresponding to the second neighboring memory cell increases from zero volt at time T4 to a voltage Vpass at time T5 to partially turn on the channel at the second neighboring memory cell of the unselected string 12. Therefore, the residual electrons at the top memory cells corresponding to the word lines WL_T_1 to WL_T_x+1 can move to the second neighboring memory cell corresponding to the word line WL_T_x+2 when they are attracted by the voltage potential provided by the voltage Vpass. Note that the voltage Vpass is applied to the word line WL_T_x+2 from time T5 at the pre-charging phase to time T11 at the boosting phase; from another point of view, the second neighboring memory cell corresponding to the word line WL_T_x+2 is turned on prior to the rest of the plurality of word lines WL_T_1 to WL_T_x+1 and WL_T_x+3 to WL_j to boost the channel potential corresponding to the word line WL_T_x+2 before entering the boosting/programming phase.

Note that the pre-charging phase in FIG. 2 begins at time T0 and ends at time T4, while the pre-charging phase in FIG. 4 begins at time T0 and ends at time T7. The pre-charging phase of the present disclosure is extended to allow the residual electrons to discharge from the bit line during the pre-charging phase.

The pre-charging phase ends at time T7, the boosting phase of the unselected string 12 and the programming phase of the selected string 10 begin at time T7 and end at time T12, in FIG. 4.

In detail, the voltage of the word line WL_T_x+1 corresponding to the first neighboring memory cell increases from zero volt at time T7 to a voltage Vcut at time T8, the voltage Vcut is applied to the word line WL_T_x+1 from time T8 to T11, and the voltage of the word line WL_T_x+1 decreases from the voltage Vcut at time T11 to zero volt at time T12. Voltages of the word lines WL_T_1 to WL_T_x−1, WL_T_x+3 to WL_T_j, WL_B_1 to WL_B_m increase from zero volt at time T7 to the voltage Vpass at time T8, the voltage Vpass is applied to the word lines WL_T_1 to WL_T_x−1, WL_T_x+3 to WL_T_j, WL_B_1 to WL_B_m from time T8 to time T11, and the voltages of the word lines WL_T_1 to WL_T_x−1, WL_T_x+3 to WL_T_j, WL_B_1 to WL_B_m decrease from the voltage Vpass at time T11 to zero volt at time T12. Voltages of the word lines WL_TD_1 to WL_TD_i, WL_MD_1 to WL_MD_k and WL_BD_1 to WL_BD_n increase from zero volt at time T7 to a voltage Vbias at time T8, the voltage Vbias is applied to the word lines WL_TD_1 to WL_TD_i, WL_MD_1 to WL_MD_k and WL_BD_1 to WL_BD_n from time T8 to time T11, and the voltages of the word lines WL_TD_1 to WL_TD_i, WL_MD_1 to WL_MD_k and WL_BD_1 to WL_BD_n decrease from the voltage Vbias at time T11 to zero volt at time T12.

During the boosting phase of the unselected string 12, the word line WL_T_x+2 corresponding to the second neighboring memory cell is applied with the voltage Vpass (T5 to T11), the word line WL_T_x+1 corresponding to the first neighboring memory cell is applied with the voltage Vcut (T8 to T11), and the word line WL_T_x corresponding to the selected memory cell is applied with the voltage Vpass (T8 to T9) and a voltage Vpgm (T10 to T11), wherein the voltage Vcut is smaller than the voltages Vpass and Vpgm. Therefore, the first neighboring memory cell is weakly turned off by the voltage Vcut, thereby the channel of the unselected string 12 is cut by the first neighboring memory cell, and memory cells located above the first neighboring memory cell are isolated from the memory cells below the first neighboring memory cell. As a result, the residual electrons can be discharged from the bit line of the unselected string 12, through the first neighboring memory cell which is weakly turned off to prevent the residual electrons from being attracted by the voltage potential provided by the voltage Vpass or Vpgm.

During the boosting phase (T8 to T11) of the unselected string 12, the channel potential of the unselected string 12 is boosted by applying the voltage Vpass to the word lines WL_T_1 to WL_T_x−1, WL_T_x+3 to WL_T_j, WL_B_1 to WL_B_m and applying the voltage Vbias to the word lines corresponding to the dummy cells, which prevents the memory cell of the unselected string 12 corresponding to the selected word line WL_T_x from being unintentionally programmed by the voltage Vpgm.

During the programming phase of the selected string 10, the channel potential corresponding to the selected memory cell is boosted by applying the voltage Vpass from time T8 to time T9. The voltage Vpgm is applied to the selected word line WL_x corresponding to the selected memory cell of the selected string 10 to perform a programming operation from time T10 to time T11.

Finally, the boosting phase and the programming phase are about to end from time T11, and all the bit lines and all the word lines decrease to zero volt at time T12 when the boosting phase and the programming phase end.

As a result, the residual electrons can be removed from the unselected string 12 during the pre-charging phase, so as to reduce program disturb to the neighboring selected string 10 during the boosting/programming phase. Moreover, by applying the voltage Von to all the word lines WL_T_1 to WL_T_j corresponding to all the plurality of top memory cells to turn on the plurality of top memory cells, the complexity of the programming operation is acceptable in comparison with the complexity of the programming operation in FIG. 2.

Figure 5:
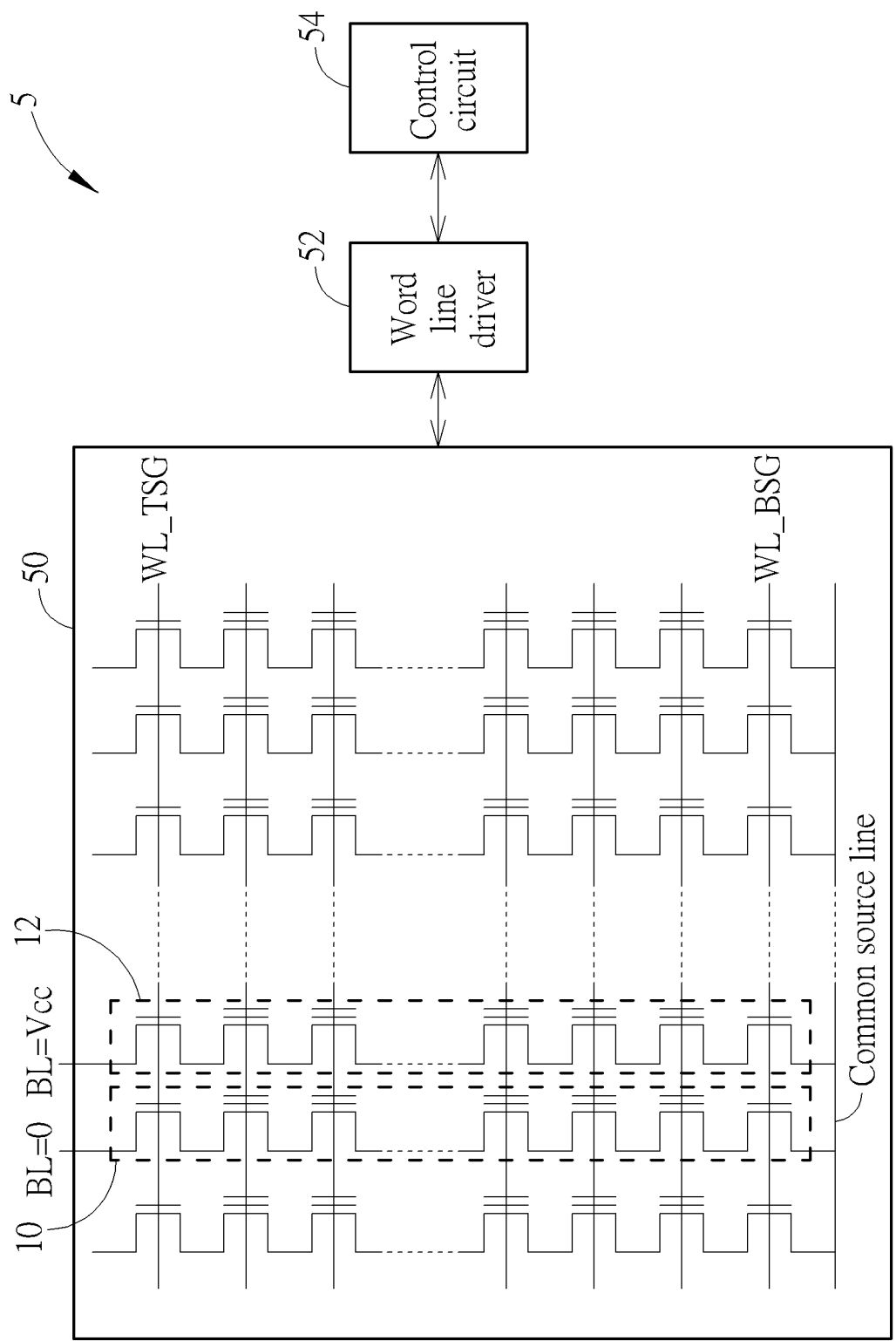
FIG. 5 is a functional block diagram of a memory device according to an embodiment of the present disclosure.

FIG. 5 is a functional block diagram of a memory device 5 according to an embodiment of the present disclosure. The memory device 5 includes a memory array 50, a word line driver 52 and a control circuit 54. The memory device 5 may be a three-dimensional NAND flash memory device. The memory array 50 includes a plurality of bit lines (BL), a plurality of word lines and a plurality of strings (e.g., the strings 10 and 12 in FIG. 3). Each string includes a plurality of memory cells and a plurality of dummy cell, wherein a plurality of memory cells and the plurality of dummy cell are connected in series and extend vertically above a substrate (not shown). The control circuit 54 is configured to generate a plurality of control signals to the word line driver 52 to perform a programming operation. The word line driver 52 is coupled to the control circuit 54 and the memory array 50, and configured to generate a plurality of voltages applied to the plurality of word lines of the memory array 50 according to the plurality of control signals generated by the control circuit 54.

Figure 6:
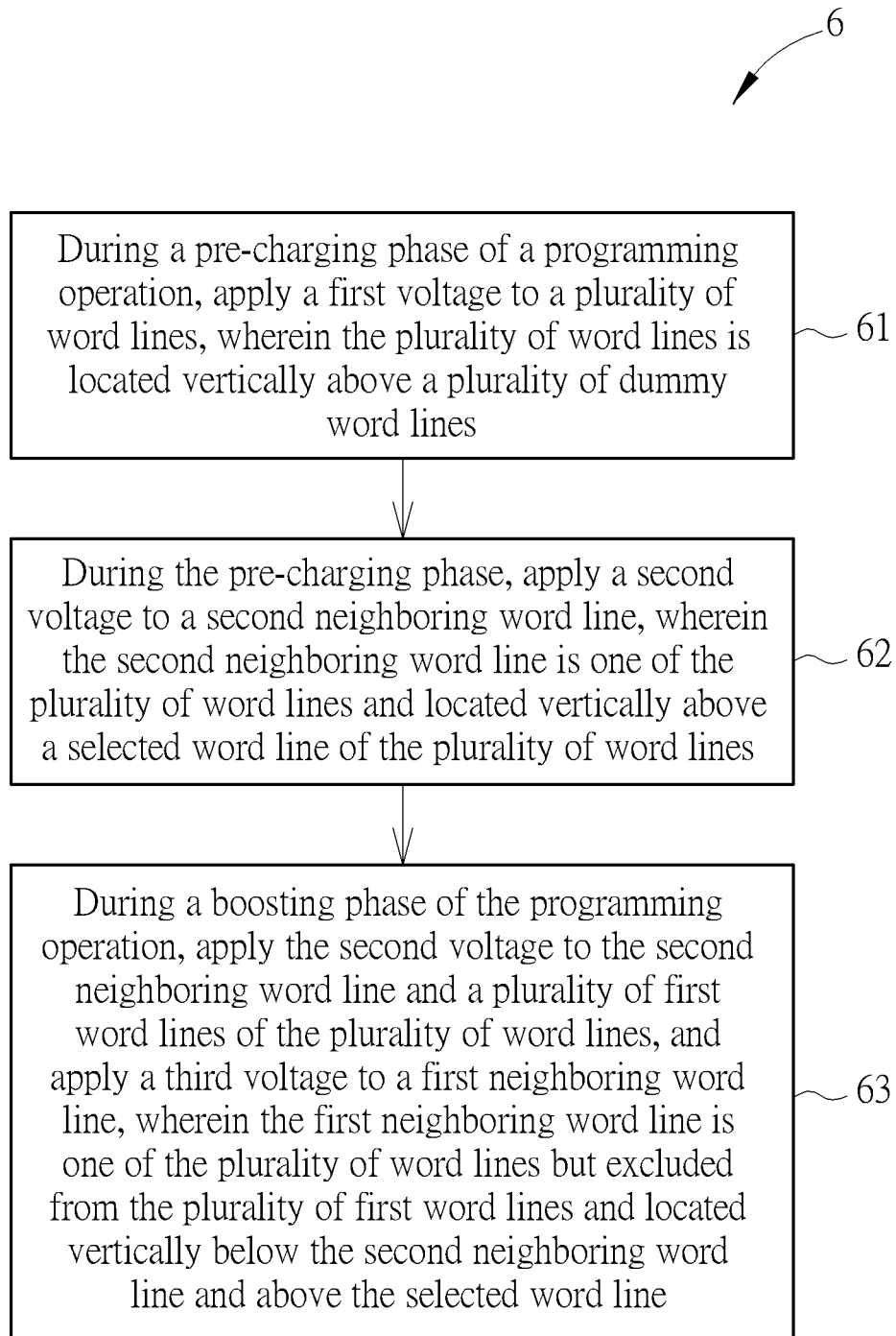
FIG. 6 is a flowchart of a process of programming operation for the strings in FIG. 3 according to an embodiment of the present disclosure.

FIG. 6 is a flowchart of a process 6 of programming operation for the strings in FIG. 3 according to an embodiment of the present disclosure. The process 6 may be performed by the control circuit 54, and include the following steps.

Step 61: During a pre-charging phase of a programming operation, apply a first voltage to a plurality of word lines, wherein the plurality of word lines is located vertically above a plurality of dummy word lines.

Step 62: During the pre-charging phase, apply a second voltage to a second neighboring word line, wherein the second neighboring word line is one of the plurality of word lines and located vertically above a selected word line of the plurality of word lines.

Step 63: During a boosting phase of the programming operation, apply the second voltage to the second neighboring word line and a plurality of first word lines of the plurality of word lines, and apply a third voltage to a first neighboring word line, wherein the first neighboring word line is one of the plurality of word lines but excluded from the plurality of first word lines and located vertically below the second neighboring word line and above the selected word line.

In Step 61, during the pre-charging phase of the programming operation, the control circuit 54 is configured to apply a first voltage (e.g., Von) to a plurality of word lines (e.g., WL_T_1 to WL_T_j), wherein the plurality of word lines (e.g., WL_T_1 to WL_T_j) is located vertically above a plurality of dummy word lines (e.g., WL_MD_1 to WL_MD_k). Therefore, the residual electrons trapped in the storage regions of the plurality of middle dummy cells can move upward to the top memory cells corresponding to the word lines WL_T_1 to WL_T_j.

In Step 62, during the pre-charging phase, the control circuit 54 is configured to apply a second voltage (e.g., Vpass) to a second neighboring word line (e.g., WL_T_x+2), wherein the second neighboring word line (e.g., WL_T_x+2) is one of the plurality of word lines e.g., WL_T_1 to WL_T_j) and located vertically above a selected word line (e.g., WL_T_x) of the plurality of word lines.

In Step 63, during the boosting phase of the programming operation, the control circuit 54 is configured to apply the second voltage (e.g., Vpass) to the second neighboring word line (e.g., WL_T_x+2) and a plurality of first word lines, and apply a third voltage (e.g., Vcut) to a first neighboring word line (e.g., WL_T_x+1), wherein the first neighboring word line (e.g., WL_T_x+1) is one of the plurality of word lines but excluded from the plurality of first word lines and located vertically below the second neighboring word line (e.g., WL_T_x+2) and above the selected word line (e.g., WL_T_x). Therefore, since the third voltage Vcut is smaller than the second voltage Vpass, the channel of the unselected string 12 is partially turned off to prevent the residual electrons from moving back to the top memory cells which are below the top memory cell corresponding to the word line WL_T_x+1. As a result, the residual electrons can be removed from the unselected string 12 to reduce program disturb to the neighboring selected string 10.

To sum up, the present disclosure provides a method of programming operation to remove residual electrons trapped in storage regions of middle dummy memory cells of the unselected string during the pre-charging phase, so as to reduce program disturb to the selected string which neighbors the unselected string. Further, by applying the voltage Von to all the word lines WL_T_1 to WL_T_j corresponding to all the plurality of top memory cells during the pre-charging phase, the complexity of the programming operation is acceptable in comparison with the complexity of the programming operation in FIG. 2.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A memory device, comprising:
   a memory array comprising memory strings, each memory string comprising a plurality of top memory cells, a plurality of bottom memory cells, and one or more dummy memory cells between the top memory cells and the bottom memory cells;
   a plurality of word lines respectively coupled to gate terminals of the top memory cells and the bottom memory cells;
   a control circuit configured to provide a control signal to control programming a target memory cell of the top memory cells, the gate terminal of the target memory cell being coupled to a selected word line of the word lines; and
   a word line driver coupled to the control circuit and the word lines and configured to, in response to the control signal, apply a positive first voltage signal to each of the word lines that are coupled to the gate terminals of the top memory cells during a first time period in a pre-charge phase prior to a programming phase.

2. The memory device of claim 1, further comprising a plurality of bit lines respectively coupled to drain terminals of the memory strings, wherein the top memory cells are between the bit lines and the dummy memory cells.

3. The memory device of claim 2, wherein the word line driver is further configured to apply a second voltage signal to a first neighboring word line of the word lines during the programming phase, the first neighboring word line being adjacent to the selected word line towards the bit lines.

4. The memory device of claim 3, wherein the word line driver is further configured to apply a third voltage signal greater than the second voltage signal to a second neighboring word line of the word lines during a second time period in the pre-charge phase and during the programming phase, the second neighboring word line being between the first neighboring word line and the bit lines.

5. The memory device of claim 4, wherein the word line driver is further configured to apply a fourth voltage signal greater than the third voltage signal to the selected word line during the programming phase.

6. The memory device of claim 4, wherein the word line driver is further configured to apply the third voltage signal to an unselected word line of the word lines during the programming phase, the unselected word line being between the second neighboring word line and the bit lines.

7. The memory device of claim 4, wherein
   the bit lines comprise a first bit line coupled to the drain terminal of a selected memory string of the memory strings, and a second bit line coupled to the drain terminal of an unselected memory string, the target memory cell being in the selected memory string; and
   the control signal is configured to cause applying a fifth voltage signal to the second bit line during the first and second time periods in the pre-charge phase.

8. The memory device of claim 7, wherein
each memory string further comprises a top select gate (TSG) transistor between the bit lines and the top memory cells; and
the word line driver is further configured to apply a sixth voltage signal to the TSG transistor during the first time period and part of the second time period in the pre-charge phase.

9. The memory device of claim 8, wherein the six voltage signal ramps down earlier than the fifth voltage signal.

10. The memory device of claim 1, wherein the word line driver is further configured to apply a zero-voltage signal to each of the word lines that are coupled to the gate terminals of the bottom memory cells during the first time period in the pre-charge phase.

11. A method for programming a memory device, the memory device comprising memory strings, each memory string comprising a plurality of top memory cells, a plurality of bottom memory cells, and one or more dummy memory cells between the top memory cells and the bottom memory cells, the method comprising:
providing a control signal to control programming a target memory cell of the top memory cells, wherein the memory device further comprises a plurality of word lines respectively coupled to gate terminals of the top memory cells and the bottom memory cells, and the gate terminal of the target memory cell is coupled to a selected word line of the word lines; and
in response to the control signal, applying a positive first voltage signal to each of the word lines that are coupled to the gate terminals of the top memory cells during a first time period in a pre-charge phase prior to a programming phase.

12. The method of claim 11, wherein the memory device further comprises a plurality of bit lines respectively coupled to drain terminals of the memory strings, the top memory cells being between the bit lines and the dummy memory cells.

13. The method of claim 12, further comprising applying a second voltage signal to a first neighboring word line of the word lines during the programming phase, the first neighboring word line being adjacent to the selected word line towards the bit lines.

14. The method of claim 13, further comprising applying a third voltage signal greater than the second voltage signal to a second neighboring word line of the word lines during a second time period in the pre-charge phase and during the programming phase, the second neighboring word line being between the first neighboring word line and the bit lines.

15. The method of claim 14, further comprising applying a fourth voltage signal greater than the third voltage signal to the selected word line during the programming phase.

16. The method of claim 14, further comprising applying the third voltage signal to an unselected word line of the word lines during the programming phase, the unselected word line being between the second neighboring word line and the bit lines.

17. The method of claim 14, wherein
the bit lines comprise a first bit line coupled to the drain terminal of a selected memory string of the memory strings, and a second bit line coupled to the drain terminal of an unselected memory string, the target memory cell being in the selected memory string; and
the method further comprises applying a fifth voltage signal to the second bit line during the first and second time periods in the pre-charge phase.

18. The method of claim 17, wherein
each memory string further comprises a top select gate (TSG) transistor between the bit lines and the top memory cells; and
the method further comprises applying a sixth voltage signal to the TSG transistor during the first time period and part of the second time period in the pre-charge phase.

19. The method of claim 18, wherein the six voltage signal ramps down earlier than the fifth voltage signal.

20. The method of claim 11, further comprising applying a zero-voltage signal to each of the word lines that are coupled to the gate terminals of the bottom memory cells during the first time period in the pre-charge phase.

* * * * *